May 30, 1967 G. J. GESSNER 3,322,967

QUADRATURE REJECTION CIRCUIT UTILIZING BILATERAL TRANSISTOR GATE

Filed March 6, 1964 2 Sheets-Sheet 1

INVENTOR.
GUNTHER J. GESSNER
BY
ATTORNEY

INVENTOR.
GUNTHER J. GESSNER
BY
Arthur T. Groeninger
ATTORNEY

United States Patent Office 3,322,967

Patented May 30, 1967

3,322,967

QUADRATURE REJECTION CIRCUIT UTILIZING BILATERAL TRANSISTOR GATE

Gunter J. Gessner, Maywood, N.J., assignor to The Bendix Corporation, Teterboro, N.J., a corporation of Delaware Filed Mar. 6, 1964, Ser. No. 349,907
3 Claims. (Cl. 307—88.5)

This invention relates to an electronically switched transistor gate circuit, and more particularly, to a gate circuit which prevents transmission of quadrature components associated with a signal applied to the gate circuit.

Quadrature is the reactive components of a current or voltage resulting from inductive or capacitive reactance in a circuit. Quadrature in control systems is undesirable because it interferes with the efficient operation of other control system devices, such as motors and servo amplifiers. In particular, the quadratures in motors cause heating and loss of torque and in servo amplifiers, cause overloading and a large reduction of inphase signals.

Briefly, the present invention includes an input signal source for providing an input signal to a gating network. The input signal is comprised of an inphase component and a component in quadrature with the inphase component. A reference signal, having the same frequency as the input signal, is applied to the control terminals of the gating circuit to control the opening and closing of the gating network. For each full cycle of reference signal, the gating network is opened twice for brief intervals to permit transmission of input signal therethrough. During these intervals, the inphase component of the input signal is at a maximum and the quadrature component of the input signal is at a minimum.

The triggering level of the gating network may change with temperature. In order to compensate for this, a pair of zener diodes are connected across the reference signal source to provide a wave having a short rise time and fall time thereby minimizing the time differential in triggering the gating network at a new level.

The gating circuit employed in the present invention is comprised of a pair of bilateral transistors which conduct with an input signal of either direction passing through them. The bilateral transistors perform a function which previously required the use of four diodes and provide the networks with a relatively large signal handling capacity.

An object of the present invention is to provide a novel quadrature rejection circuit.

Another object of the present invention is to provide a quadrature rejection circuit which is temperature stabilized making higher rejection ratios possible.

Another object of the present invention is to provide a quadrature rejection circuit having a relatively large signal handling capacity.

Another object of the present invention is to provide a gating circuit having a minimum number of parts for increased reliability and for minimizing bias requirements for operation of the gating circuit.

Another object of the present invention is to provide a quadrature rejection circuit using bilateral transistors.

These and other objects and features of the invention are pointed out in the following description in terms of the embodiment thereof which is shown in the accompanying drawings. It is to be understood, however, that the drawings are for the purpose of illustration only and are not a definition of the limits of the invention, reference being had to the appended claims for this purpose.

Figure 1:
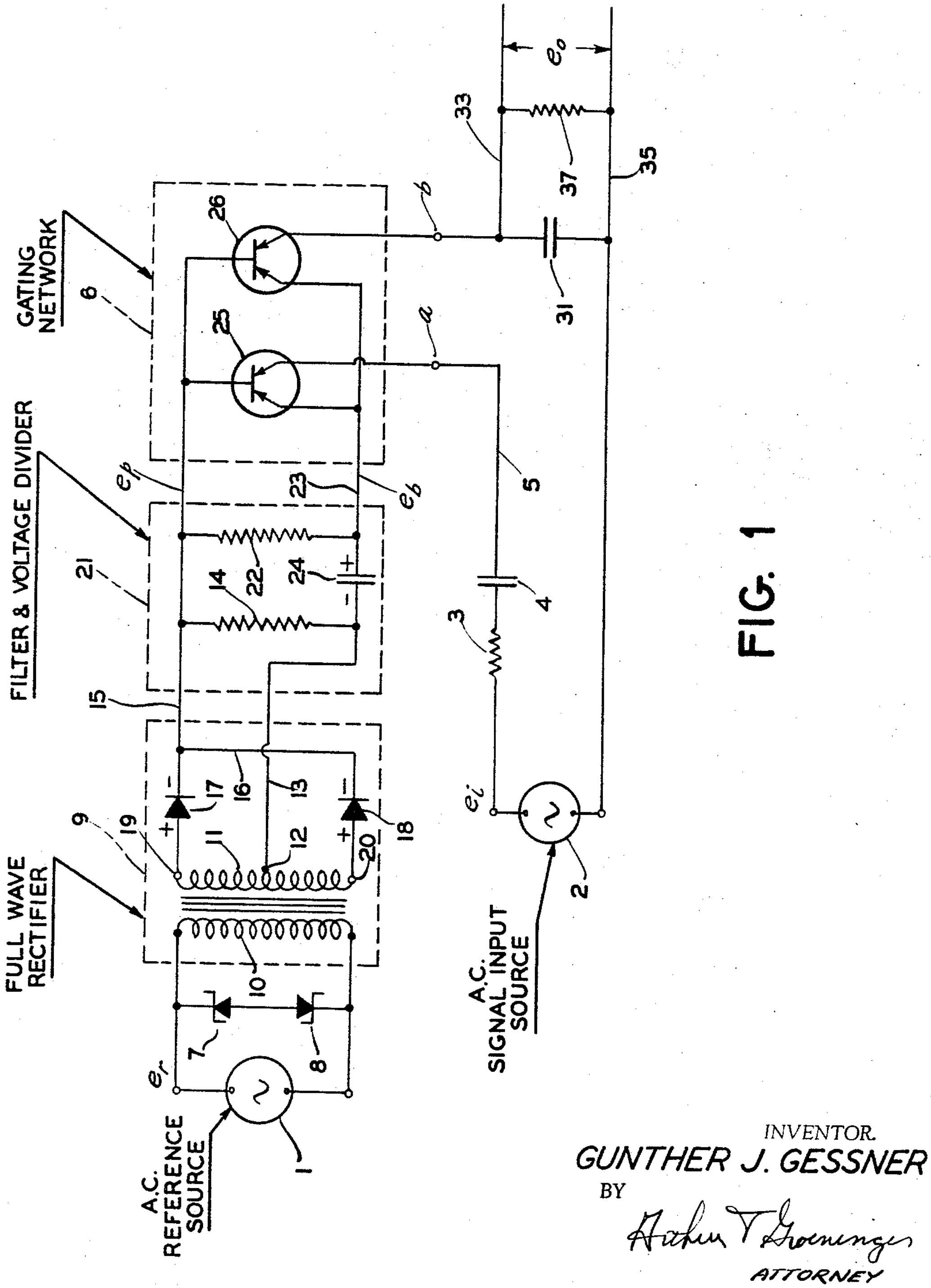
FIGURE 1 is a circuit diagram of a quadrature rejection circuit constructed in accordance with the present invention.
Figure 2:
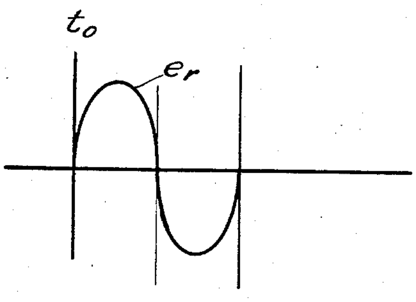
FIGURE 2 shows the waveform of a single cycle of reference signal $e_r$.

Referring to FIGURE 1, an alternating current reference signal source is shown at 1 and an alternating current signal input source is shown at 2. The A.C. reference $e_r$ and the A.C. input signal $e_i$ are of the same frequency, The waveforms of single cycles of the A.C. reference $e_r$ and the A.C. input signal $e_i$, referenced to a time $t_o$, are shown in FIGURES 2 and 3, respectively.

Figure 3:
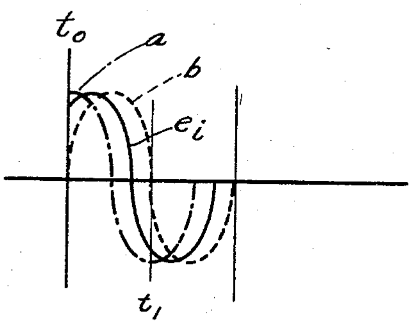
FIGURE 3 shows the waveform of a single cycle of the input signal, $e_i$, applied to the quadrature rejection circuit. The input signal $e_i$ is comprised of an inphase component *a* and quadrature component *b*.

As shown in FIGURE 3, the A.C. input signal $e_i$ is comprised of an input component, bearing the legend *a*, and a quadrature component, bearing the legend *b*. For clarity of illustration, the amplitude of the input signal $e_i$ is shown enlarged relative to the amplitude of the reference signal $e_r$.

The input signal $e_i$ is fed through resistor 3, coupling capacitor 4, and conductor 5 to input terminal *a* of gating circuit 6. Coupling capacitor 4 is used to eliminate and prevent extraneous D.C. signals associated with the input signal $e_i$, from affecting the bias of the gating circuit.

As will be hereinafter explained, the reference signal $e_r$ is used to control the opening and closing of the gating network 6 so as to transmit the inphase component *a* and to prevent transmission of the quadrature component *b*. Variations in the time at which the gating network is triggered, such as occurs when the triggering level of the gating network 6 is changed as a result of a temperature change, can result in a substantial change in the phase rejection ratio of gating network 6. In order to compensate for this, a pair of zener diodes 7 and 8 are connected across the reference signal source 1 to provide a substantially square wave $e_p$ having a short rise time and fall time. Due to the short rise time and fall time of the square wave $e_p$, the time differential in triggering the gating network at a new level is minimized. With this arrangement, high rejection ratios are possible as there is no need to increase the on time of the gate to assure a valid sample of the inphase component *a*.

Figure 4:
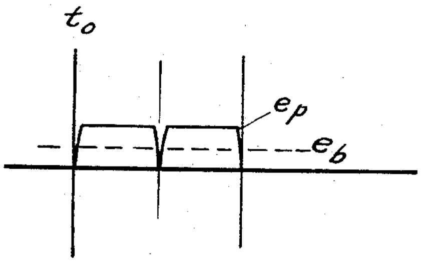
FIGURE 4 shows the waveform of the rectified reference signal $e_p$ and the filtered reference signal $e_b$ which are applied to the control terminals of the quadrature rejection circuit.

A full wave rectifier 9 is provided and includes a power transformer whose primary 10 is connected to the A.C. reference source 1. The transformer secondary 11 is center tapped at 12. The center tap 12 is returned through conductor 13, resistor 14, and conductors 15 and 16 to the cathodes of diodes 17 and 18. Points 19 and 20 of transformer secondary 11 are connected to the anodes of diodes 17 and 18, respectively. Hence, the A.C. voltage developed from point 19 to center tap 11 is applied across diode 17 and the A.C. voltage developed from point 20 to center tap 13 is applied across diode 18. The two diodes 17 and 18 conduct alternately since, at any given instant, one anode is positive and the other is negative; a half cycle later, the polarity of the voltages is reversed. The waveshape of an output signal $e_p$ from rectifier 9 for a single cycle of reference signal input is shown in FIGURE 4.

The rectified output from rectifier 9 is fed by conductors 15 and 13 to filter and voltage divider network 21. Network 21 is comprised of a first resistor 14 connecting conductor 15 to conductor 13, a second resistor 22 connecting conductor 15 to conductor 23 and a capacitor 24 connecting conductor 13 to conductor 23.

The rectified output $e_p$ feeds through resistor 22 and charges capacitor 24. Capacitor 24 and resistor 22 are of sufficient size to provide a long time constant relative to the period of the cycle of the rectified voltage $e_p$ so that there is built up and maintained across capacitor 24 a substantially constant charge $e_b$ shown by a broken line in FIGURE 4. Resistor 14 is of much smaller resistance than resistor 22 so that the time constant of resistor 14 with capacitor 24 is shorter than the time constant of resistor 22 with capacitor 24 to deliver as much gating current as possible during the conducting interval.

The rectified signal $e_p$ and the D.C. signal $e_b$ are applied, respectively, by conductors 15 and 23 to gating network 6. The gating network 6 comprises a pair of transistors 25 and 26, with input terminal $a$ feeding into transistor 25 and an output terminal $b$ being connected to transistor 26.

Transistors 25 and 26 are bilateral transistors which conduct with input signal $e_i$ of either direction passing through them. Transistors 25 and 26 may be symmetrical alloy germanium units of pnp configuration in which either junction serves equally well as collector or emitter. Bilateral switching transistors are described in detail in Application Notes (March 1961) published by Texas Instruments Incorporated, Semi-conductor Components Division, Post Office Box 5012, Dallas 22, Texas.

During the portion of the cycle when the rectified signal $e_p$, applied to the base of transistors 25 and 26, exceeds the filtered signal $e_b$, applied to the emitters of transistors 25 and 26, the transistors 25 and 26 are reverse biased and a path from input terminal $a$ to output terminal $b$ has a very high impedance (in effect, open circuit). When the rectified signal $e_p$ is smaller than the filtered signal $e_b$, transistors 25 and 26 are forwardly biased and there is a low impedance between input terminal $a$ and output terminal $b$.

Referring now to the waveforms shown in FIGURES 3 and 4, and in particular to the waveform of the rectified signal $e_p$ with the level of the filtered signal $e_b$ shown on the same coordinate, it will be observed that when the signal $e_b$ exceeds $e_p$, the gate 6 is closed and the input signal $e_i$ passes from input terminal $a$ to output terminal $b$. At this time, the inphase component $a$ is passing through its maximum values and the quadrature component is passing through its minimum values, as shown in FIGURE 3. It will be further observed that when the signal $e_p$ exceeds signal $e_b$, the gate 6 is open and input signal $e_i$ can not pass from input terminal $a$ to output terminal $b$. At this time, the inphase component $a$ is passing through its minimum values and the quadrature component $b$ is passing through its maximum values, as shown in FIGURE 3.

The amplitude of the input signal $e_i$ should be kept smaller than the amplitude of the rectified signal $e_p$ so as to prevent the quadrature component $b$ from affecting the bias of the gating network 6. The amplitude of input signal $e_i$, as shown in FIGURE 3, has been enlarged, relative to signal $e_p$, as shown in FIGURE 4, to provide a clear showing of components $a$ and $b$.

Briefly summarizing, at time $t_0$, the gate 6 is closed and the inphase component $a$ is at a maximum positive value resulting in a positive pulse being transmitted from input terminal $a$ to output terminal $b$ to clamp a positive potential on capacitor 31. Capacitor 31 cooperates with resistor 3 during the time gate 6 is closed to provide a time constant enabling the capacitor 31 to charge to the peak value of the inphase component $a$. Gate 6 then opens as signal $e_p$ exceeds signal $e_b$. The capacitor 31 cooperates with a load resistor 37 connected across the output conductors 33 and 35 during the time the gate 6 is opened to provide a time constant of sufficient duration to deliver a full area waveform. At time $t_1$, the gate 6 is again closed. At this time, the inphase component $a$ is at a maximum negative value and a negative pulse is transmitted from input terminal $a$ to output terminal $b$ to clamp a negative potential on capacitor 31. This negative charge will be held on the capacitor 31 until the next time the gate 6 is opened in the next cycle.

Figure 5:
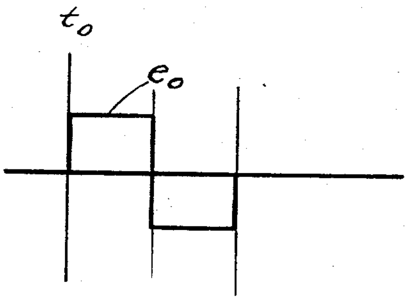
FIGURE 5 shows the waveform of a single cycle of the output signal $e_o$ from the quadrature rejection circuit.

The amplitude of the charge on capacitor 31 is proportional to the amplitude of the inphase component $a$ of input signal $e_i$. An output signal $e_o$ is taken across capacitor 31 by output conductors 33 and 35 and is a square wave which varies in amplitude in accordance with the amplitude of the inphase component of the input signal $e_i$. A waveform of a single cycle of output signal references to the time $t_0$ is shown in FIGURE 5 bearing the legend $e_o$. It should be noted that the output signal $e_o$ is phase shifted approximately 90° from the inphase component and is free from quadrature.

Although only one embodiment of the invention has been illustrated and described, various changes in the form and relative arrangements of the parts, which will now appear to those skilled in the art may be made without departing from the scope of the invention. Reference is, therefore, to be had to the appended claims for a definition of the limits of the invention.

I claim:

1. A quadrature rejection circuit, comprising:

means for providing an input signal, said input signal having an inphase component and a component in quadrature with the inphase component;

signal generating means for providing a signal having a substantially square waveform with a predetermined rise and fall time;

a gate comprising first and second bilateral transistors each of which has a base, a first emitter and a second emitter;

means including a resistor and a capacitor connected in series, said means being connected to the second emitter of the first bilateral transistor and to the input signal means for applying the input signal to the gate;

the base and the first emitter of each of the first and second bilateral transistors being connected to the signal generating means so that the gate is opened by the signal therefrom for providing at the second emitter of the second transistor the inphase component of the input signal, and the gate being closed by the signal from the signal generating means for preventing said quadrature component of said input signal from being provided at the second emitter of the second transistor; and means connected to the second emitter of the second transistor and responsive to the signal thereat for providing a signal proportional to the amplitude of the inphase component.

2. A quadrature rejection circuit as described by claim 1 in which:

the resistor and capacitor of said input signal applying means being connected in series to the first transistor for applying the input signal thereto, and said capacitor being so arranged as to prevent extraneous direct current signals associated with the input signal from affecting the gate.

3. A quadrature rejection circuit as described by claim 2 including:

a capacitor connected to the second transistor so that there is provided by the gate an output signal having an amplitude varying in accordance with the amplitude of the inphase component of the input signal.

References Cited

UNITED STATES PATENTS

| | | | |
|---|---|---|---|
| 2,829,251 | 4/1958 | Patton -------------- | 328—166 |
| 3,024,448 | 3/1962 | Wright et al. ------ | 307—88.5 |
| 3,030,522 | 4/1962 | Fennick ----------- | 328—166 |
| 3,041,479 | 6/1962 | Sikorra ------------ | 328—166 |
| 3,231,752 | 1/1966 | Jacob -------------- | 307—88.5 |
| 3,244,978 | 4/1966 | Propis et al. -------- | 328—166 |

ARTHUR GAUSS, *Primary Examiner.*

R. H. EPSTEIN, *Assistant Examiner.*